United States Patent
Ho et al.

(10) Patent No.: US 7,193,547 B2
(45) Date of Patent: Mar. 20, 2007

(54) DAC/ADC SYSTEM

(75) Inventors: Jung-Feng Ho, Chieh Lung (TW); Wen-Chung Lai, Taipei (TW)

(73) Assignee: Realtek Semiconductor Corp., Hsin Chu (TW)

( * ) Notice: Subject to any disclaimer, the term of this patent is extended or adjusted under 35 U.S.C. 154(b) by 0 days.

(21) Appl. No.: 10/778,403

(22) Filed: Feb. 17, 2004

(65) Prior Publication Data
US 2004/0196168 A1    Oct. 7, 2004

(30) Foreign Application Priority Data
Apr. 4, 2003    (TW) ............... 92107838 A

(51) Int. Cl.
H03M 1/66    (2006.01)
(52) U.S. Cl. ..................... 341/144; 341/143
(58) Field of Classification Search ............... 341/144, 341/155, 143; 379/399.01
See application file for complete search history.

(56) References Cited

U.S. PATENT DOCUMENTS 5,999,581 A * 12/1999 Bellaouar et al. ......... 375/377
6,052,156 A * 4/2000 Mukai et al. ............. 348/642
6,097,259 A * 8/2000 Saito et al. ................ 332/103
6,167,132 A * 12/2000 Krone et al. .......... 379/399.01

FOREIGN PATENT DOCUMENTS

WO    WO99/56427    * 11/1999

* cited by examiner

Primary Examiner—Jean Bruner Jeanglaude
(74) Attorney, Agent, or Firm—Birch, Stewart, Kolasch & Birch, LLP

(57) ABSTRACT

A DAC/ADC system for generating reference clocks for DAC/ADC by a look-up table method. The DAC/ADC system includes a sampling signal generator, a DAC, and an ADC. The sampling signal generator generates first and second sampling signals according to first and second reference clocks by a look-up table method, respectively. The DAC receives a digital input signal and converts it into an analog output signal according to the first sampling signal. The ADC receives an analog input signal and converts it into a digital output signal according to the second sampling signal.

15 Claims, 4 Drawing Sheets

US 7,193,547 B2

DAC/ADC SYSTEM

This Nonprovisional application claims priority under 35 U.S.C. § 119(a) on Patent Application No(s). 092107838 filed in TAIWAN on Apr. 4, 2003, the entire contents of which are hereby incorporated by reference.

BACKGROUND OF THE INVENTION

1. Field of the Invention

The invention relates to a DAC (Digital-to-Analog Converter)/ADC (Analog-to-Digital Converter) system, and more particularly to a DAC/ADC system for generating reference clocks by a look-up table method.

2. Description of the Related Art

FIG. 1 shows a block diagram of a conventional DAC system using the sigma-delta modulation technology. Referring to FIG. 1, the DAC system 10 includes an up-sampling unit 11, a digital low-pass filter (LPF) 12, a sigma-delta modulator 13, a DAC unit 14, and an analog LPF 15. The up-sampling unit 11 receives a digital input signal and up-samples the digital input signal to N times thereof. For example, the digital input signal, such as a x-bit PCM signal with a sampling frequency fs1, is up-sampled by the up-sampling unit 11 and generates a x-bit PCM signal with a sampling frequency $N*fs1$. Next, the digital LPF 12 filters out the output signal of the up-sampling unit 11 and generates an up-sampling signal with the sampling frequency $N*fs1$. The sigma-delta modulator 13 modulates the up-sampling signal into a y-bit modulated signal with a sampling frequency $N*fs1$, wherein y<x. The modulated signal further passes through the DAC unit 14 and the analog LPF 15 and becomes an analog output signal.

FIG. 2 shows a block diagram of a conventional ADC system using the sigma-delta modulation technology. Referring to FIG. 2, the ADC system 20 includes an ADC unit 21, a digital LPF 22, and a down-sampling unit 23. The ADC unit 21 samples the analog input signal using the sampling frequency of $N*fs2$, and generates a y-bit digital signal with a sampling frequency $N*fs2$. The digital signal passes through the digital LPF 22 and the down-sampling unit 23, and then becomes a x-bit digital output signal with a sampling frequency fs2, wherein y<x.

Because the DAC system 10 and ADC system 20 may use different sampling frequencies in different occasions, there must have sampling signal generators for generating different sampling frequencies. The typical sampling signal generators for generating the sampling frequency of $N*fs$ will be described in the following.

1. A phase locked loop (PLL) or a digital phase locked loop (DPLL), for example, may directly generate the sampling signal with a sampling frequency $N*fs$. However, the drawback of this method is that the operation frequency of the modulator 13 is reduced as the sampling frequency is reduced, such that the high-frequency noises brought up by the modulator 13 fall within the audible range with a greater ratio. In addition, the PLL requires more circuit complexity to implement, which is not advantageous when considering system integration or fabrication technology transferring. Furthermore, the noises brought by the PLL may adversely influence the performance of the analog circuit.

2. A sigma-delta clock modulator, for instance a two-order sigma-delta clock modulator, may be used to generate the sampling signal with an average sampling frequency $N*fs$ for the ADC unit 21 of the ADC system 20, or the modulator 13 of the DAC system 10. FIG. 3 shows the architectures of such ADC system and DAC system. Referring to FIG. 3, in addition to the elements of FIG. 1, the DAC system 30 further includes a sigma-delta clock modulator 36 for generating a reference clock with an average frequency of $N*fs1$. On the other hand, in addition to the elements of FIG. 2, the ADC system 30' further includes a sigma-delta clock modulator 37 for generating a sampling clock with an average frequency of $N*fs2$. Therefore, in the ADC/DAC system described above, two clock modulators for generating sampling signals have to be included.

SUMMARY OF THE INVENTION

It is therefore one of the many objects of the invention to provide a DAC system, which adjusts a sampling frequency thereof using a look-up table method.

Another object of the invention is to provide an ADC system, which adjusts a sampling frequency thereof using a look-up table method.

Still another object of the invention is to provide a DAC/ADC system, which adjusts sampling frequencies thereof using a look-up table method.

According to embodiments of the invention, a DAC/ADC system for converting a digital input signal and an analog input signal into an analog output signal and a digital output signal, respectively, is disclosed. The DAC/ADC system comprises: a look-up table for generating a first sampling signal and a second sampling signal according to a sampling frequency of the digital input signal and a sampling frequency of the digital output signal respectively; a DAC system for converting the digital input signal into the analog output signal according to the first sampling signal; and an ADC system for converting the analog input signal into the digital output signal according to the second sampling signal.

DETAILED DESCRIPTION OF THE INVENTION

The DAC/ADC system according to embodiments of the invention will be described with reference to the accompanying drawings.

Figure 1:
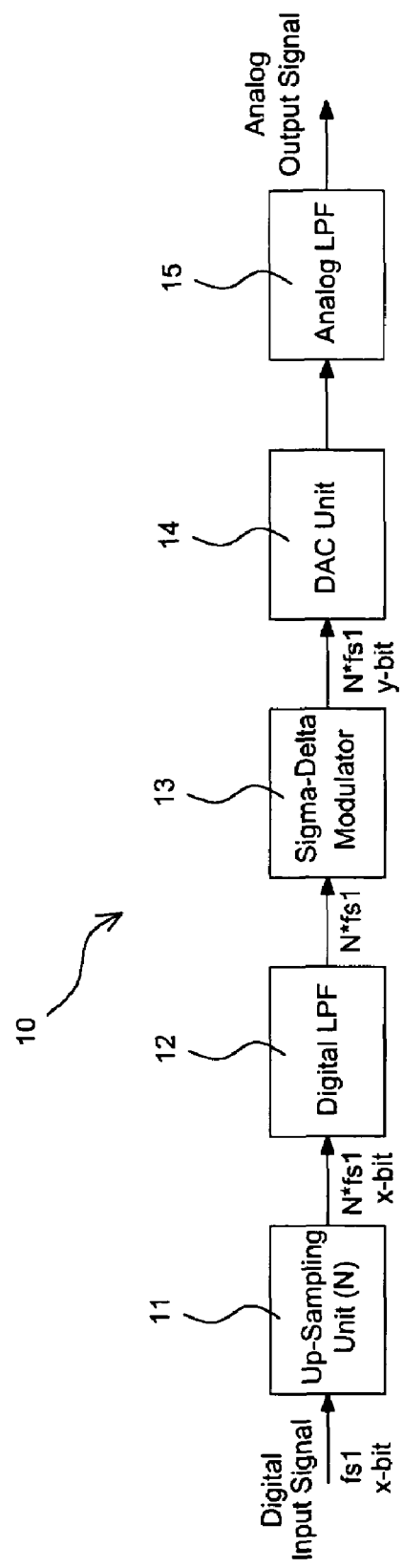
FIG. 1 shows a block diagram of a conventional DAC system using a sigma-delta modulation technology.
Figure 2:
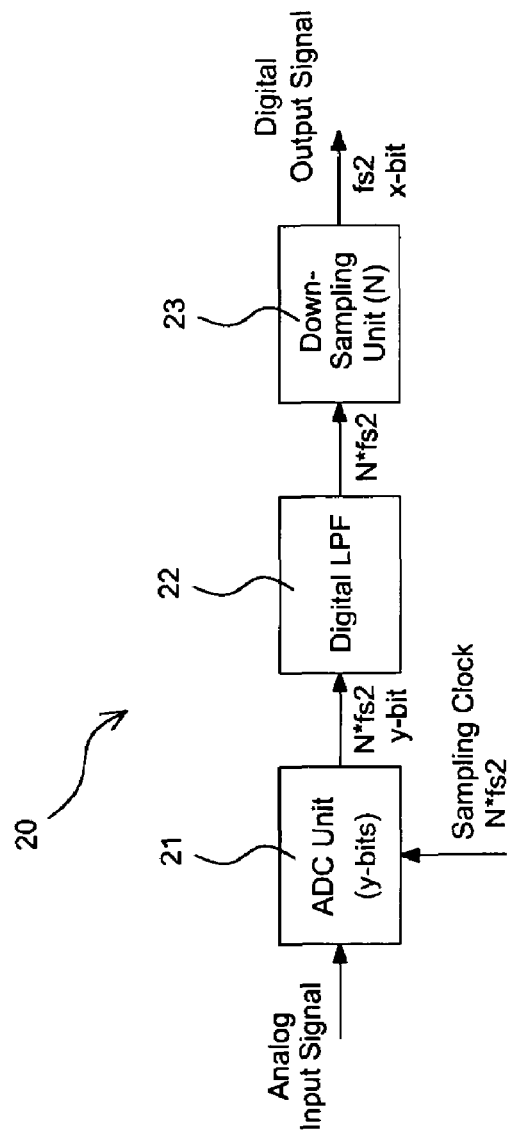
FIG. 2 shows a block diagram of a conventional ADC system using a sigma-delta modulation technology.
Figure 3:
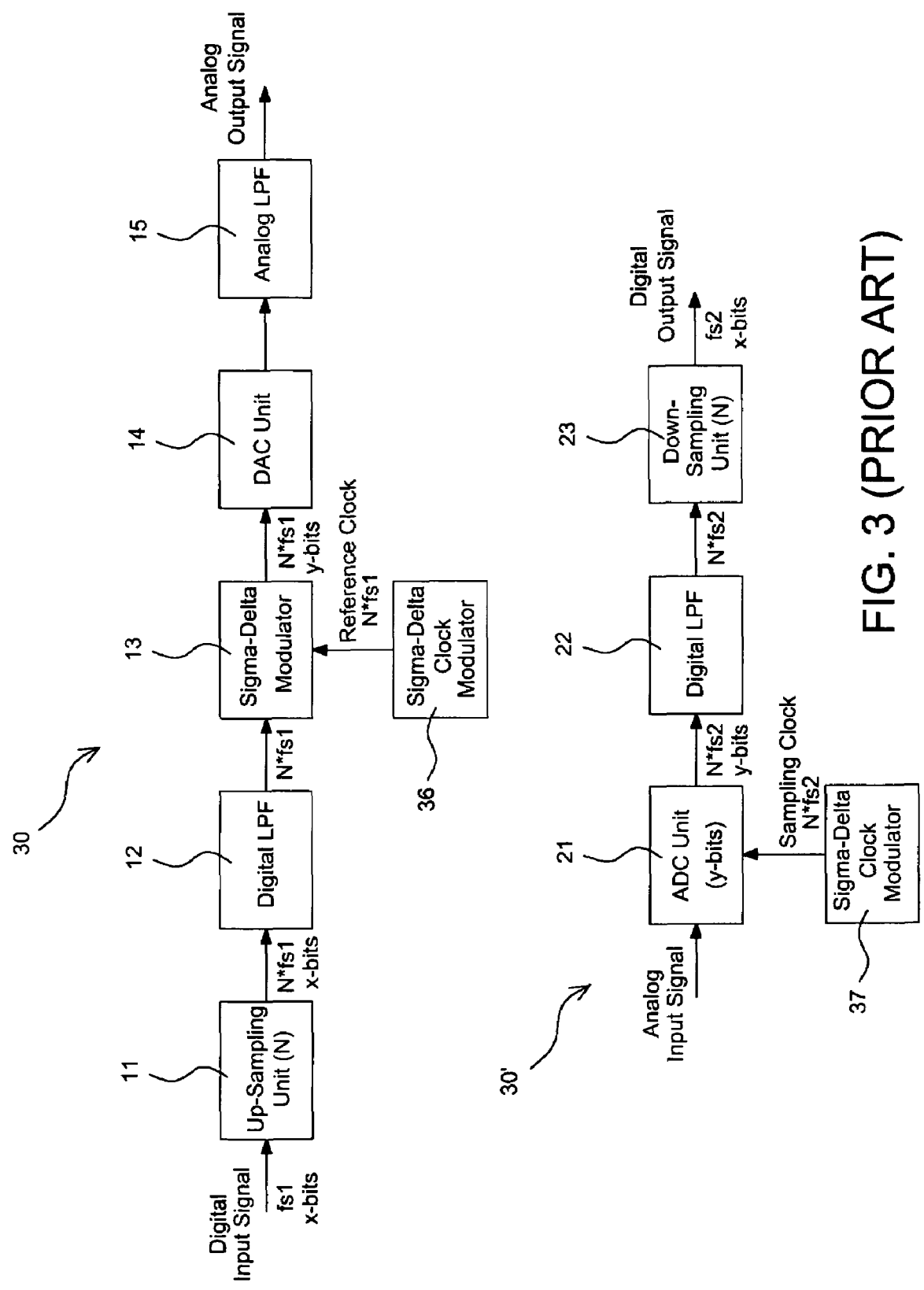
FIG. 3 shows architectures of conventional ADC system and conventional DAC system, which generate clock signals using two sigma-delta modulators.
Figure 4:
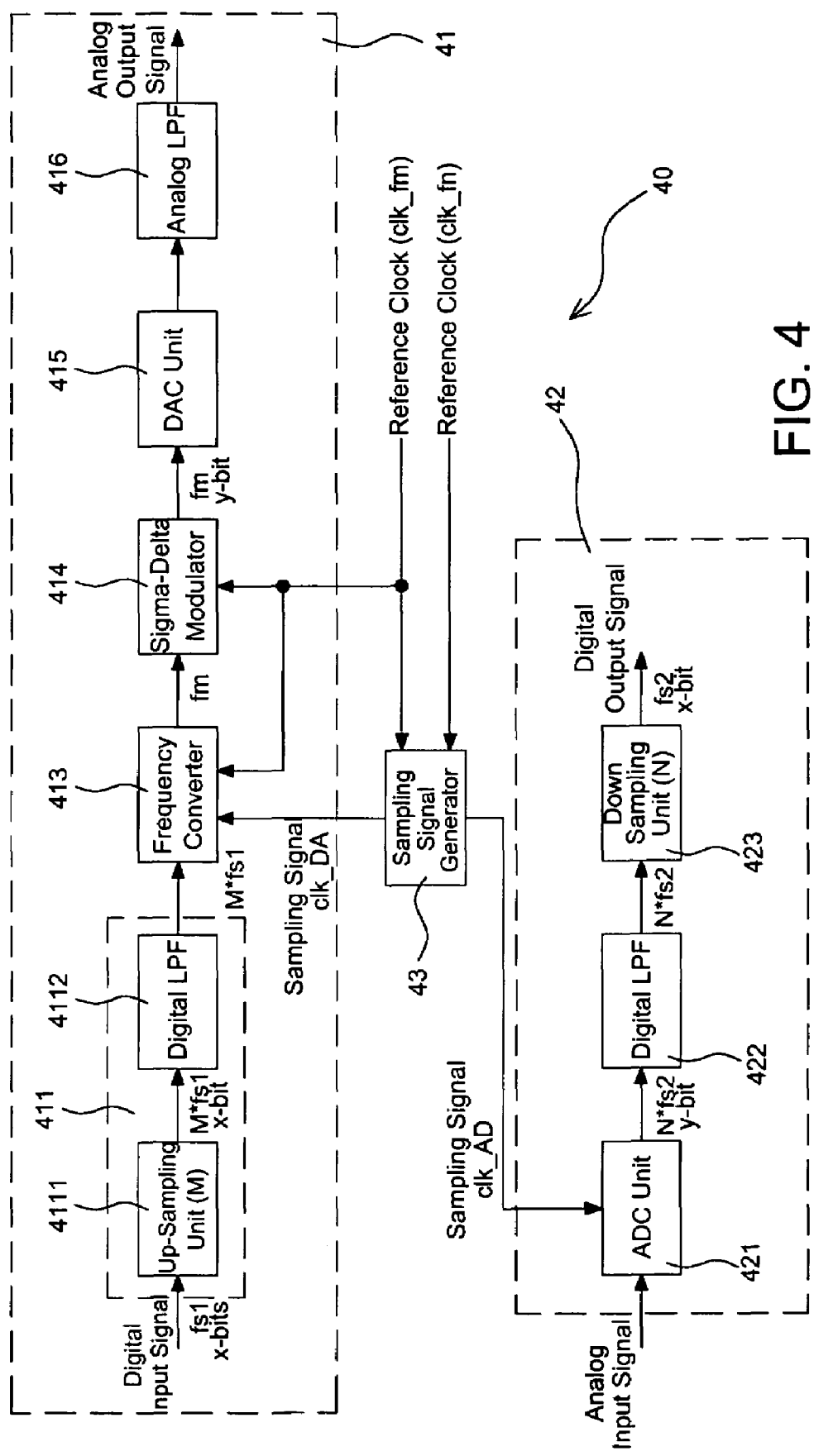
FIG. 4 shows a block diagram of a DAC/ADC system according to an embodiment of the invention.

FIG. 4 shows a block diagram of a DAC/ADC system according to an embodiment of the invention. Referring to FIG. 4, the DAC/ADC system 40 of the invention includes a DAC system 41, an ADC system 42, and a sampling signal generator 43. The DAC system 41 converts a digital input signal into an analog output signal, and the ADC system 42 converts an analog input signal into a digital output signal. In addition, the sampling signal generator 43 according to this embodiment of the invention generates sampling signals clk_DA and clk_AD required by the DAC system 41 and ADC system 42, respectively.

The DAC system 41 includes an interpolator 411, a sigma-delta modulator 414, a DAC unit 415, an analog LPF 416, and a frequency converter 413, wherein the interpolator 411 may include an up-sampling unit 4111 and a digital LPF 4112. The architectures and functions of the up-sampling unit 4111, the digital LPF 4112, the sigma-delta modulator 414, the DAC unit 415, and the analog LPF 416 are similar to those aforementioned, and detailed descriptions thereof will be omitted. The x-bit digital input signal has the sampling frequency of fs1, and is up-sampled to produce a up-sampling digital signal according to an up-sampling ratio (M), and the DAC unit 415 has the operating frequency of fm, wherein fm>M*fs1. Therefore, the frequency converter 413 converts the up-sampling digital signal, which has the sampling frequency of M*fs1 and is generated by the interpolator 411, into a fixed-frequency digital signal according to a first sampling signal $clk_{13}DA$, wherein the fixed-frequency digital signal has the fixed sampling-frequency of fm. A relationship between the sampling frequency fs1 and the first sampling signal $clk_{13}DA$ is predetermined, and the average pulse number of persecond the first sampling signal clk_DA is M*fs1. The sigma-delta modulator 414 modulates the fixed-frequency digital signal output from the frequency converter 413 into a modulated signal according to a reference clock clk_fm. Because the frequency of the fixed-frequency digital signal output to the sigma-delta modulator 414 is desired to be a constant, the frequency of the reference clock $clk_{13}fm$ may be fixed to fm.

Figure 5:
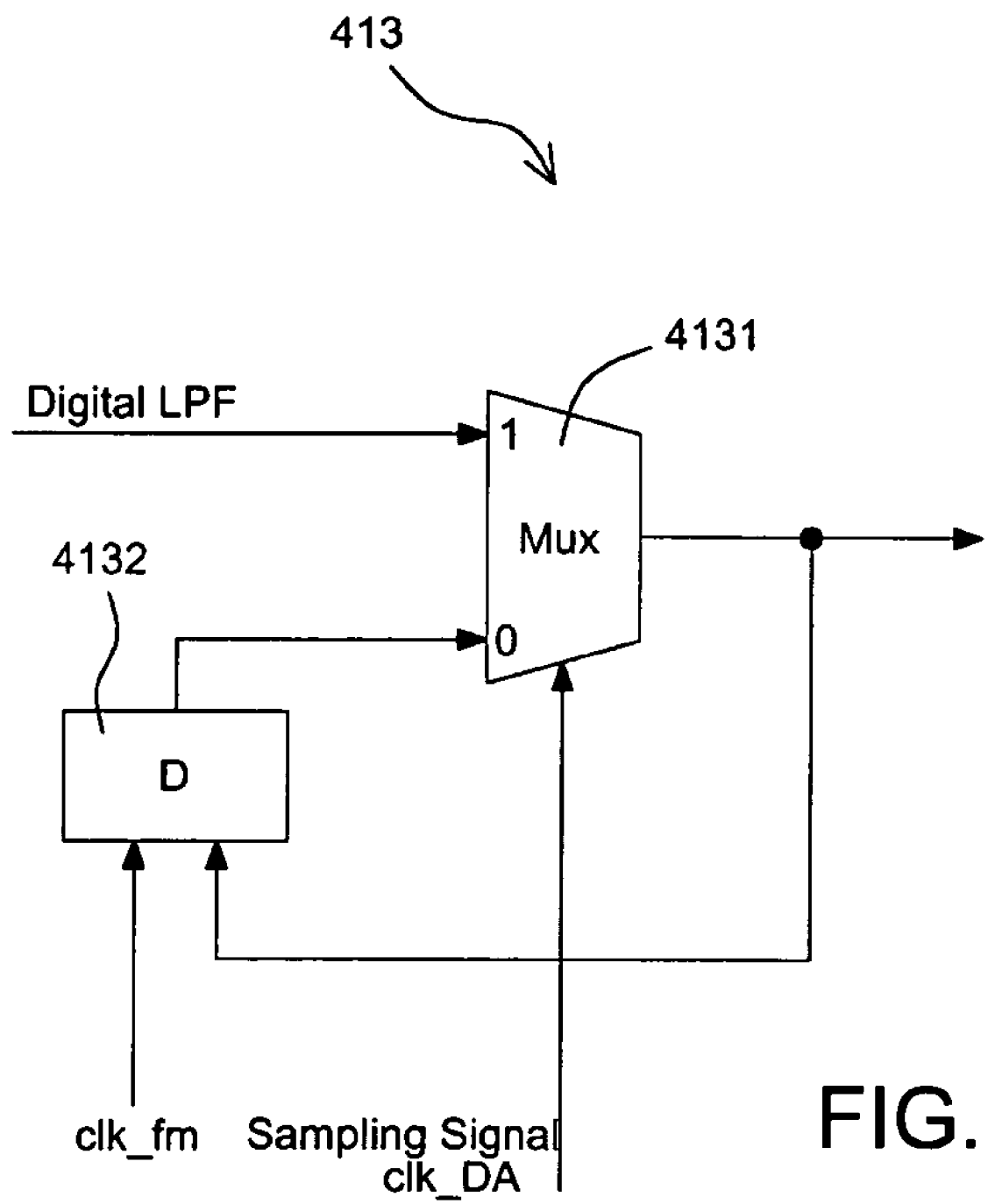
FIG. 5 shows a block diagram of a frequency converter of FIG. 4 according to an embodiment of the invention.

FIG. 5 shows a block diagram of a frequency converter 413 of FIG. 4. Referring to FIG. 5, the frequency converter 413 includes a multiplexer 4131 and a register 4132. The multiplexer 4131 receives the up-sampling digital signal output from the interpolator 411 and a buffered signal output from the register 4132, and the output signal of the multiplexer 4131 is controlled by the first sampling signal clk_DA. The register 4132 receives and temporarily stores the output signal of the multiplexer 4131. When the state of the first sampling signal clk_DA is High ("1"), the multiplexer 4131 outputs the up-sampling digital signal from the interpolator 411. On the contrary, when the state of the sampling signal clk_DA is Low ("0"), the multiplexer 4131 outputs the buffered signal from the register 4132. Consequently, with the operating frequency of the first sampling signal clk_DA being fm, the frequency converter 413 may convert the signal with an original sampling frequency of M*fs1 into another signal having a sampling frequency of fm by merely setting the probability of appearance of states High in the first sampling signal clk_DA to be M*fs1/fm.

Referring again to FIG. 4, the ADC system 42 is similar to the conventional ADC system 30' in the aspect of including an ADC unit 421, a digital LPF 422, and a down-sampling unit 423. The ADC system 42 according to an embodiment of the invention generates the desired second sampling signal $clk_{13}AD$ from the sampling signal generator 43. The sampling frequency of the digital output signal of the ADC system 42 is fs2, the analog input signal is sampled by N*fs2, and the operating frequency of the ADC unit 421 is fn, wherein fn>N*fs2. The average pulse number persecond of the second sampling signal $clk_{13}AD$ is N*fs2. In addition, the relationship between the second sampling signal $clk_{13}AD$ and the sampling frequency fs2 is predetermined.

Moreover, the sampling signal generator 43 according to an embodiment of the invention generates the desired frequency according to a look-up table. The look-up table may be implemented by memories or logic circuits with the same function. The sampling signal generator 43 stores the information of 0 or 1 in the look-up table, and outputs the contents of the look-up table, which serve as the sampling signal clk_DA of the DAC system 41 or the sampling signal clk_AD of the ADC system 42, in a sequentially repeated manner or an intermittently repeated manner according to the reference clock clk_fm or clk_fn, wherein the reference clock clk_fm may have a frequency fm, while the reference clock clk_fn may have a frequency fn in this embodiment, respectively.

It is assumed hereinafter that the total bit number of the look-up table is BN, and the number of bits with a content of 1 in the look-up table is n1. As a result, when a sampling signal clk_DA with a pulse number of M*fs1 per second is desired, all that is needed to be done is to set the ratio of n1/BN to be M*fs1/fm. When a sampling signal clk_AD with a pulse number of N*fs2 per second is desired, all that is needed to be done is to set the ratio of n1/BN to be N*fs2/fn. Therefore, the clock with the original frequency of fm or fn may be converted into the reference clock with the frequency of M*fs1 or N*fs2 as long as the contents of the look-up table are output according to the reference clock clk_fm or clk_fn. Meanwhile, different look-up tables may be used in conjunction with different values of M or N. That is, all that is needed to be done is to switch the ratio of n1/BN among different look-up tables. Of course, if M or N is changed to integer times of itself, the contents of the look-up table may be output in the intermittently repeated manner so that a different output frequency may be obtained.

When M*fs1/fm and N*fs2/fn have the same ratio, the same look-up table mode and the same look-up table may be utilized. For example, when fs1=48K, M=64, fm=6M, fs2=48K, N=128 and fn=12M, the sampling signal generator 43 may look up the same look-up table to generate the desired sampling signals clk_DA and clk_AD for the DAC 41 and ADC 42 because M*fs1/fm=N*fs2/fn. If fs2 is changed to 24K, the same look-up table may still be utilized as long as it is adjusted. For instance, a "0" may be inserted between two bits or every second searched "1" may be discarded so as to generate a half frequency without an additionally created look-up table. Of course, another look-up table may be created in order to enhance the system performance. Consequently, when fs2 or fs1 is 48k, 24k, 12k or 6k, a single look-up table may be commonly utilized. In addition, in the condition when 32k/48k =2/3, the same look-up table also may be utilized. In this case, every third searched "1" may be discarded, or a "0" may be inserted among three bits. Moreover, when fs2 or fs1 is 44.1 k, 22.05 k and 11.025 k, a single look-up table may be commonly used.

For example, if fs 1=48K, M=64 and fm=6M, the ratio of the number of "1" to the total number of "0" and "1" in the look-up table is 64/125 because M*fs1/fm =64/125, and the ratio of the number of "0" to the total number of "0" and "1" is 61/125. If BN of the look-up table is 125, there are several combinations for optionally inserting 61 units among 125 units. Of course, because not all of the combinations are certainly suitable, the suitable combinations should be simulated as satisfying the system performance. The condition for the look-up table should satisfy the demand of small in-band noises so as to prevent the converted signal from being distorted to an unacceptable level.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A digital to analog converter (DAC) system for converting a digital input signal to an analog output signal, comprising:
   an interpolator for generating an up-sampling signal according to the digital input signal;
   a frequency converter for generating a converted-frequency signal according to a ratio of the frequency of the up-sampling signal to the frequency of the converted-frequency signal, said frequency converter comprising:
      a register for storing the data of converted-frequency signal; and
      a multiplexer for receiving the up-sampling signal and the output data of the register, and outputting the converted-frequency signal according to the ratio;
   a modulator for modulating the converted-frequency signal to output a modulated signal; and
   a digital to analog converting unit for generating the analog output signal according to the modulated signal.

2. The DAC system of claim 1, wherein the frequency of the converted-frequency signal is constant.

3. The DAC system of claim 1, wherein the frequency of the converted-frequency signal is independent of the frequency of the up-sampling signal.

4. The DAC system of claim 1, wherein the ratio is recorded in a look-up table.

5. The DAC system of claim 1, wherein the digital to analog converting unit operates at an operating frequency and the operating frequency is independent of the digital input signal.

6. The DAC system of claim 1, wherein the digital to analog converting unit operates at an operating frequency and the operating frequency is higher than the frequency of the up-sampling signal.

7. The DAC system of claim 1, wherein the interpolator further comprises:
   an up-sampling unit for receiving the digital input signal and generating a first signal; and
   a digital low-pass filter for filtering the first signal to generate the up-sampling signal.

8. An analog to digital converter (ADC) system for converting an analog input signal to a digital output signal, the ADC system comprising:
   a look-up table for outputting a plurality of bits, the plurality of bits comprising a plurality of first bits with a specified value; and
   an analog to digital converting unit having an operating frequency for converting the analog input signal to a digital output signal according to the plurality of bits;
   wherein the number of the plurality of bits is BN, the number of the plurality of first bits is n1 and the value of n1 divided by BN is proportional to the value of the frequency of the digital output signal divided by the operating frequency.

9. The ADC system of claim 8, wherein the look-up table generates the first bits in a sequentially repeated manner or an intermittently repeated manner.

10. The ADC system of claim 8, wherein the specified value is 1.

11. The ADC system of claim 8, wherein the value of n1 divided by BN is substantially equal to the value of the frequency of the digital output signal divided by the operating frequency.

12. A digital to analog converter (DAC) system for converting a digital input signal to an analog output signal, comprising:
   an interpolator for generating an up-sampling signal according to the digital input signal;
   a frequency converter for generating a converted-frequency signal according to a plurality of bits;
   a modulator for modulating the converted-frequency signal to output a modulated signal;
   a digital to analog converting unit for generating the analog output signal according to the modulated signal; and
   a look-up table coupled to the frequency converter for outputting the plurality of bits, the plurality of bits comprising a plurality of first bits with a specified value;
   wherein the number of the value of n1 divided by BN is proportional to the value of the frequency of the plurality of bits is BN, the number of the plurality of first bits is n1 and digital output signal divided by the operating frequency.

13. The DAC system of claim 12, wherein the look-up table generates the first bits in a sequentially repeated manner or an intermittently repeated manner.

14. The DAC system of claim 12, wherein the specified value is 1.

15. The ADC system of claim 12, wherein the value of n1 divided by BN is substantially equal to the value of the frequency of the digital output signal divided by the operating frequency.

* * * * *